US008884502B2

(12) United States Patent
Aurongzeb et al.

(10) Patent No.: US 8,884,502 B2
(45) Date of Patent: Nov. 11, 2014

(54) OLED ASSEMBLY AND LUMINAIRE WITH REMOVABLE DIFFUSER (75) Inventors: Deeder Aurongzeb, Mayfield Heights, OH (US); Thomas Alexander Knapp, Cleveland, OH (US); Olivia Boyle, Cleveland, OH (US)

(73) Assignee: General Electric Company, Schenectady, NY (US)

( * ) Notice: Subject to any disclaimer, the term of this patent is extended or adjusted under 35 U.S.C. 154(b) by 246 days.

(21) Appl. No.: 13/189,806

(22) Filed: Jul. 25, 2011

(65) Prior Publication Data
US 2013/0026513 A1    Jan. 31, 2013

(51) Int. Cl.
H01L 51/52      (2006.01)
F21V 3/04       (2006.01)
F21V 17/10      (2006.01)
F21V 5/00       (2006.01)
F21V 17/00      (2006.01)
F21V 3/02       (2006.01)
F21V 1/14       (2006.01)
F21Y 105/00     (2006.01)

(52) U.S. Cl.
CPC .............. *F21V 17/002* (2013.01); *F21V 17/10* (2013.01); *F21V 5/002* (2013.01); *H01L 2251/5323* (2013.01); *H01L 2251/5338* (2013.01); *F21V 3/02* (2013.01); *Y02B 20/36* (2013.01); *H01L 51/5268* (2013.01); *F21V 1/146* (2013.01); *H01L 2251/5361* (2013.01); *F21Y 2105/008* (2013.01)
USPC ........... 313/110; 313/116; 313/504; 313/506; 313/511; 257/98; 257/100

(58) Field of Classification Search
USPC .................. 313/498–512, 110, 116
See application file for complete search history.

(56) References Cited

U.S. PATENT DOCUMENTS

| 3,218,446 A | 11/1965 | Langer |
| 5,162,696 A | 11/1992 | Goodrich |
| 5,414,606 A | 5/1995 | Weingartner |
| 6,498,592 B1 * | 12/2002 | Matthies ........................ 345/1.1 |
| 6,776,496 B2 | 8/2004 | Cok |

(Continued)

FOREIGN PATENT DOCUMENTS

| EP | 1534049 A2 | 5/2005 |
| FR | 2688575 A1 | 9/1993 |
| WO | 2010131172 A2 | 11/2010 |

OTHER PUBLICATIONS

Machine English transaltion of FR 2688575 to Dubuisson.*

(Continued)

*Primary Examiner* — Sikha Roy
(74) *Attorney, Agent, or Firm* — GE Global Patent Operation; Peter T. DiMauro (57) ABSTRACT An OLED assembly comprises a base and a planar OLED device mounted on the base. A planar light diffuser sheet is removably attached relative to the base and OLED device. A releasable attachment mechanism is operably configured between the light diffuser sheet and the base. The light diffuser sheet is oriented relative to the OLED device so as to provide a selected diffusive property to light emitted from the OLED device. The light diffuser sheet is removable from the base upon release of the attachment mechanism and can be substituted with a different light diffuser sheet. A luminaire may incorporate the OLED assembly, wherein the luminaire has fixture in which the OLED assembly is received.

18 Claims, 9 Drawing Sheets

(56) References Cited

U.S. PATENT DOCUMENTS

| | | | |
|---|---|---|---|
| 7,075,220 B2* | 7/2006 | Ito et al. | 313/466 |
| 7,075,226 B2 | 7/2006 | Cok | |
| 7,465,678 B2* | 12/2008 | Bhattacharya et al. | 438/780 |
| 8,430,530 B2* | 4/2013 | Aurongzeb et al. | 362/249.04 |
| 8,764,239 B2* | 7/2014 | Burrows et al. | 362/249.08 |
| 2004/0160166 A1 | 8/2004 | Cok | |
| 2005/0052827 A1* | 3/2005 | Kim | 361/638 |
| 2005/0073624 A1* | 4/2005 | Lee et al. | 349/58 |
| 2005/0169002 A1 | 8/2005 | Steen et al. | |
| 2006/0043912 A1* | 3/2006 | Foust et al. | 315/312 |
| 2008/0089060 A1 | 4/2008 | Kondo et al. | |
| 2008/0252819 A1* | 10/2008 | Hung | 349/65 |
| 2009/0009684 A1* | 1/2009 | Hsiao | 349/58 |
| 2009/0015747 A1* | 1/2009 | Nishizawa et al. | 349/58 |
| 2009/0206761 A1 | 8/2009 | Heller | |
| 2009/0257219 A1 | 10/2009 | Doubek | |
| 2010/0296279 A1 | 11/2010 | Ko | |
| 2011/0114924 A1 | 5/2011 | Aurongzeb et al. | |
| 2012/0162995 A1* | 6/2012 | Levermore | 362/311.02 |

OTHER PUBLICATIONS

PCT Search Report and Written Opinion dated May 6, 2013 from corresponding Application No. PCT/US2012/046604.

* cited by examiner

OLED ASSEMBLY AND LUMINAIRE WITH REMOVABLE DIFFUSER

BACKGROUND OF THE INVENTION

A. Field of the Invention

The field of the invention relates generally to lighting fixtures or luminaires, and more particularly to a luminaire that incorporates a flexible OLED (organic light emitting diode) assembly.

B. Description of Related Art

Organic electroluminescent devices, such as organic light emitting diodes (OLEDs), are widely used for display applications, and the use of such devices in general lighting applications is gaining acceptance. An OLED device includes one or more organic light emitting layers disposed between two electrodes (e.g., a cathode and an anode) formed on a substrate. An encapsulating cover is disposed over the cathode and functions to seal and protect the underlying layers. The OLED device may be "top-emitting," wherein the produced light is emitted through the cover, or "bottom-emitting," wherein the produced light is emitted through the substrate. The organic light emitting layers emit light upon application of a voltage across the anode and cathode, whereby electrons are directly injected into the organic layers from the cathode and holes are directly injected into the organic layers from the anode. The electrons and the holes travel through the organic layers until they recombine at a luminescent center. This recombination process results in the emission of photons. i.e., light.

A growing use for wide area (typically larger than 200 cm$^2$) OLED devices is as a light source in lighting fixtures or "luminaires." Conventional OLED devices are, however, generally flat, planar devices, which limits their usefulness in certain lighting applications. In this regard, efforts have been made to modify OLED devices for use in more conventional three-dimensional lighting fixtures. For example, U.S. Pat. No. 7,075,226 describes a lighting apparatus that includes a flexible OLED device that can be transported and stored in a flat configuration, and subsequently configured into a three-dimensional shape within a lighting fixture.

OLED devices are an efficient, high-brightness light source, but are not without certain inherent drawbacks, particularly when used as a luminaire light source. Many types of OLED devices include a plurality of individual OLED elements formed on a common substrate, which results in the individual OLED elements being visually distinguishable. This characteristic may not be desirable in certain luminaire applications. In addition, the light from an OLED device is particularly bright, and may be too harsh for certain types of luminaires. OLED devices may include differently colored OLED elements, which may be beneficial for advertising displays and the like, but may not be desirable in wide area lighting applications.

U.S. Pat. No. 6,776,496 describes a lighting apparatus that utilizes a flat, planar OLED device removably received in a lighting fixture. The '496 patent discourages the use of "bulky reflectors and diffusers" and suggests that the substrate or cover layer may be frosted to provide light diffusion. This arrangement requires additional processing of the OLED device and, once the device is made, provides no option as to the nature or diffusive properties of the emitted light.

Therefore, an ongoing need exists in the industry for an improved, more versatile OLED device that is particularly suitable as a light source in a wide variety of lighting fixtures and applications.

Figure 1:
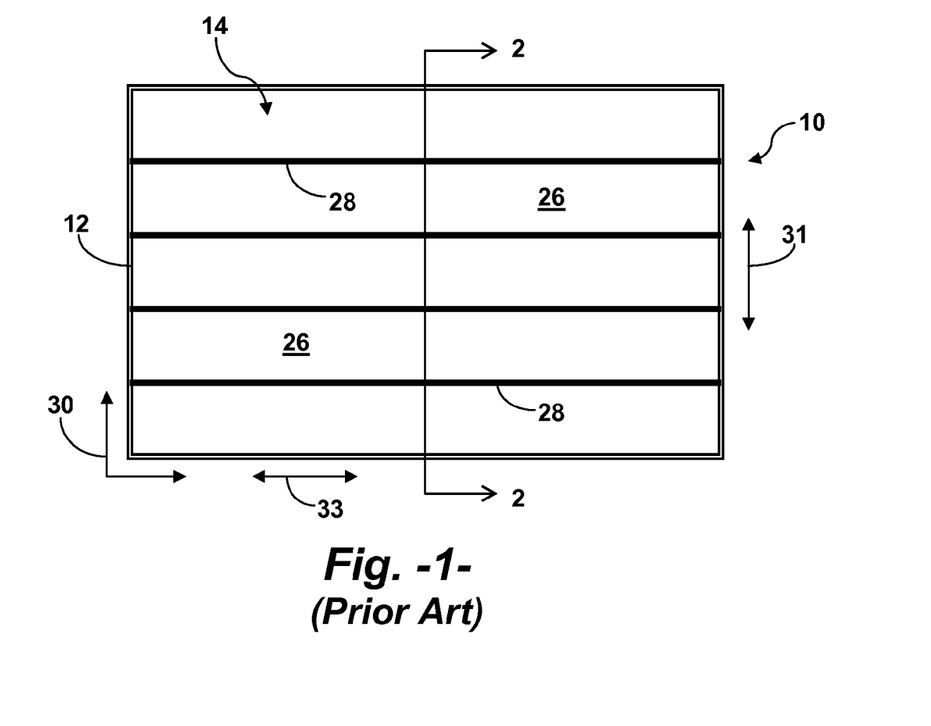
FIG. 1 is a front planar view of a conventional OLED device that incorporates a plurality of individual OLED elements.

FIG. 1 is a top planar view of a conventional OLED device 10 that may be utilized in an OLED assembly in accordance with aspects of the invention. The OLED device 10 is illustrated as a generally flat, planar member having a width 31 and a length 33. It should be appreciated that the rectangular shape of the OLED device 10 in FIG. 1 is for illustrative purposes only, and that a suitable OLED device 10 may have any desired shape, size, or other configuration.

The OLED device 10 in FIG. 1 includes a plurality of individual OLED devices 14 configured on a suitable rigid or pliable substrate 12. The OLED elements 14 are disposed lengthwise across the substrate 12, and each OLED element defines a generally continuous, unbroken light region 26. The OLED elements 14 are separated by scribe lines or gaps 28 that are formed during the deposition process wherein the various material layers are deposited on the substrate 12, as is well known in the art. The OLED device 10 has an active light area 30 that is defined essentially by the surface area of the OLED elements 14, particularly the light regions 26. An OLED device 10 having an active light area 30 of greater than about 200 cm$^2$ is generally considered as a "large" or "wide" area device, and is particularly well-suited as a light source that may be incorporated into any manner of luminaire or light fixture.

Figure 2:
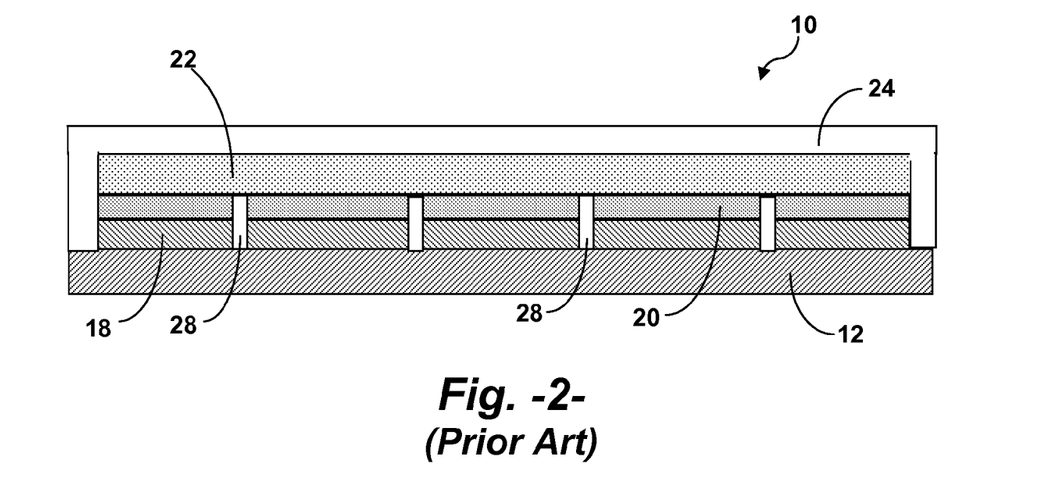
FIG. 2 is a cross-sectional view of the conventional OLED device of FIG. 1 taken along the lines indicated.

FIG. 2 is a cross-sectional view of a bottom-emitting OLED device 10 wherein light is emitted through the substrate layer 12, which is clear or translucent. The OLED device 10 could also be a top-emitting device wherein light is emitted through an opposite cover layer 24. A first electrode layer 18 is deposited on the flexible substrate 12, which may be designated as the anode layer for sake of reference. For a bottom-emitting device, the anode layer 18 is also transparent. The anode layer 18 generally comprises a material having a low work function value such that a relatively small voltage causes emission of electrons from the anode 18. The anode 18 may comprise, for example, indium tin oxide (ITO), tin oxide, nickel, or gold. The anode 18 may be formed by conventional deposition techniques, such as vapor deposition, sputtering, and so forth.

One or more layers of organic light emitting materials 20 are deposited on the anode 18. A variety of organic light emitting material layers are known for use in OLED devices. In the embodiment of FIG. 2, the organic light emitting layer 20 is a single layer, and may comprise, for example, a conjugated luminescent polymer, a hole-transporting polymer doped with electron transport molecules and a luminescent material, or an inert polymer doped with hole transporting molecules and a luminescent material. The organic light emitting layer 20 may also comprise an amorphous film of luminescent small organic molecules, which can be doped with other luminescent molecules. According to other embodiments of the invention, the organic light emitting layer 20 may include two or more sub-layers which carry out the functions of hole injection, hole transport, electron injection, electron transport, and luminescence.

A cathode layer 22 is deposited on the organic light emitting layer 20 by any suitable deposition technique. The cathode layer 22 may comprise, for example, calcium or a metal such as gold, indium, manganese, tin, lead, aluminum, silver, magnesium, or a magnesium/silver alloy. Alternatively, the anode can be made of two layers to enhance electron injection. Examples include a thin inner layer of LiF followed by a thicker outer layer of aluminum or silver, or a thin inner layer of calcium followed by a thicker outer layer of aluminum or silver.

FIG. 2 depicts the individual OLED elements 14 as defined by "cutting" through the anode 18 and light emitting layer 20

(for example in a laser scribing technique), as indicated by the scribe lines 28. The cathode 22 is then applied as a common electrode layer to the plurality of OLED elements 14, and is thus considered a "high work function" layer in that it must be capable of carrying current for all of the OLED elements 14.

A protective cover 24 is typically applied over the cathode layer 22 and forms a generally hermetic seal over the underlying layers. This cover may be formed from various suitable materials, including an oxide or nitride coated semiconducting or insulating polymer (e.g., polyethylene terephthalate, PEN, or other enforced transparent polymer), or a thin ceramic (e.g., silicon nitride, oxide, or combination of both). In a particular embodiment, the cover 24 may incorporate a thermally conductive layer, such as one or more layers of a metal or metal alloy, for example silver, aluminum, tin, copper, steel, and so forth. Alternatively, the cover 24 may be formed from a thermally conductive material, such as aluminum nitride.

BRIEF DESCRIPTION OF THE INVENTION

Aspects and advantages associated with one or more embodiments of the invention will be set forth in part in the following description, or may be apparent from the description, or may be learned through practice of embodiments of the invention.

Embodiments of the present invention provide a unique and versatile OLED assembly that is particularly useful as a light source in a luminaire fixture. The OLED assembly utilizes a removable and replaceable light diffuser sheet to provide a variety of different diffused light characteristics from the same OLED device and fixture. The versatility of this feature should be attractive to consumers and manufacturers alike. For example, a single "standard" OLED assembly may be produced, with different light characteristics provided by interchangeable diffuser sheets. A consumer need not purchase and maintain multiple OLED assemblies to enjoy varying light features, but need only to have on hand different diffuser sheets. Likewise, a manufacturer can provide lighting versatility to consumers without multiple manufacturing lines for different OLED devices. The OLED assembly has usefulness as a rigid or flexible light source in any manner of luminaire.

In a particular embodiment, an OLED assembly includes a base, and a planar OLED device mounted on the base. A replaceable planar light diffuser sheet is removably attached over the OLED device with a releasable attachment mechanism operably configured between the light diffuser sheet and base. The light diffuser sheet may be selected for its particular diffusive properties and is readily removable and replaceable with a different light diffuser sheet that provides different diffusive properties. In this regard, embodiments of the OLED assembly may be a "kit" that includes any number of additional light diffuser sheets.

The light diffuser sheets may provide any combination of desired properties to the light emitted from the OLED device. For example, the OLED device may include a plurality of OLED elements separated by visually distinct boundaries (e.g., scribe lines or masking gaps). These visually apparent boundaries may not be desirable in certain lighting fixtures wherein the OLED assembly is visible, and a light diffuser sheet may be selected that diffuses the light at a certain diffusion angle that renders the boundaries less visibly distinct. In a different embodiment, the OLED device may include a plurality of OLED elements that produce different colored light. The light diffuser sheet may merge the different colored lights into a generally homogeneous light, or render the boundaries of adjacent differently colored OLED elements non-discernable.

The base component may be variously configured. In a particular embodiment wherein the OLED assembly is intended as a light source in a luminaire, the base may include electrical contacts configured for releasable receipt within the luminaire fixture. The base may be a rigid, non-conformable member such that the OLED assembly maintains a rigid configuration before and after receipt in the luminaire fixture. In an alternate embodiment, the base is a flexible, conformable member that is bendable into a three-dimensional shape within the luminaire fixture, with the OLED device and light diffuser sheet being flexible members that conform with the base.

The releasable attachment mechanism may also vary within the scope of the invention. In one embodiment, a plurality of posts are spaced around a perimeter of the base, with the light diffuser sheet having a plurality of complimentary holes that mate with the posts to position and retain the light diffuser sheet on the base. The OLED device may also include a plurality of complimentary holes that mate with the posts, such that the OLED device is sandwiched between the base and light diffuser sheet on the posts. In still a different embodiment, the attachment mechanism may include any manner of releasable fasteners that extend through aligned holes in the light diffuser sheet and base. With this embodiment, the OLED device can be surface mounted, which is not possible with a traditional glass-based or rigid substrate OLED.

The releasable attachment mechanism is not limited to mechanical devices. A releasable adhesive may be provided between the light diffuser sheet and underlying member, or a hook-and-loop type of fastener, and so forth.

In certain embodiments, the attachment mechanism may include adjustable spacers to change a gap distance between the light diffuser sheet and the OLED device so as to vary the diffusive properties of the light diffuser sheet.

Embodiments of the invention also encompass any manner of luminaire that utilizes an OLED assembly as presented herein as a light source, for example as a removable component of a luminaire fixture.

For example, an OLED luminaire in accordance with aspects of the invention may include an OLED assembly having a plurality of diffuser sheets arranged in a three-dimensional array on the fixture, such as in a pyramidal or box-shaped luminaire wherein the multiple diffuser sheets are removable and replaceable in the three-dimensional array with diffuser sheets having different light diffusive properties. In a particular embodiment, the OLED luminaire is a pyramidal structure having at least two diffuser sheets extending from the base at an angle relative to one or more OLED devices and meeting at an apex of the pyramidal structure. This embodiment may further include an additional vertically oriented planar OLED device extending from the base towards the apex, with the OLED device being a single-directional light emitting device or a bi-directional light emitting device.

In a further embodiment, the three-dimensional array may be a multi-sided, box-type structure wherein multiple diffuser sheets extend from the fixture around a perimeter of the OLED device.

The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. The same reference characters are used to indicate the same or similar components in the drawings and description. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention encompasses such modifications and variations as come within the scope of the appended claims and their equivalents.

Figure 3:
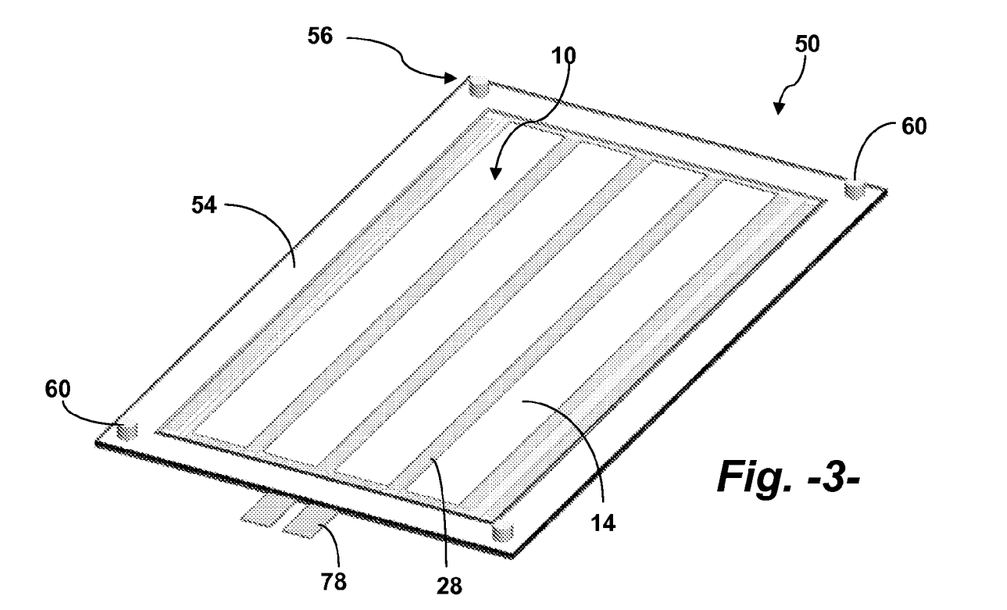
FIG. 3 is a perspective view of an embodiment of an OLED assembly in accordance with aspects of the invention.
Figure 4:
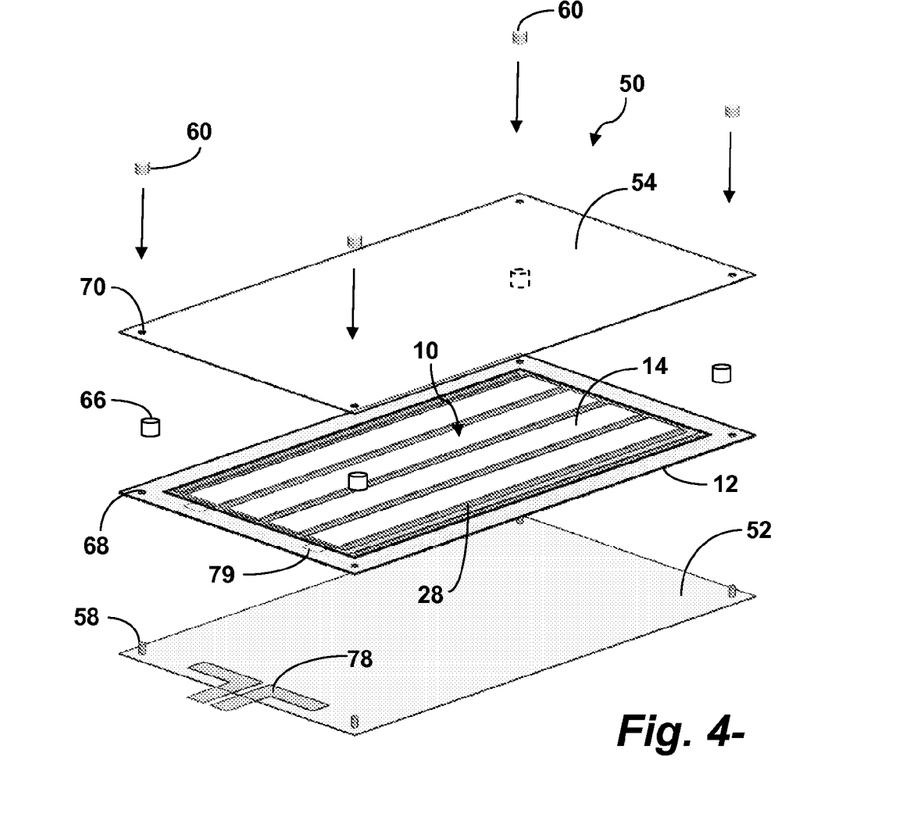
FIG. 4 is a component view of the OLED assembly of FIG. 3.
Figure 14:
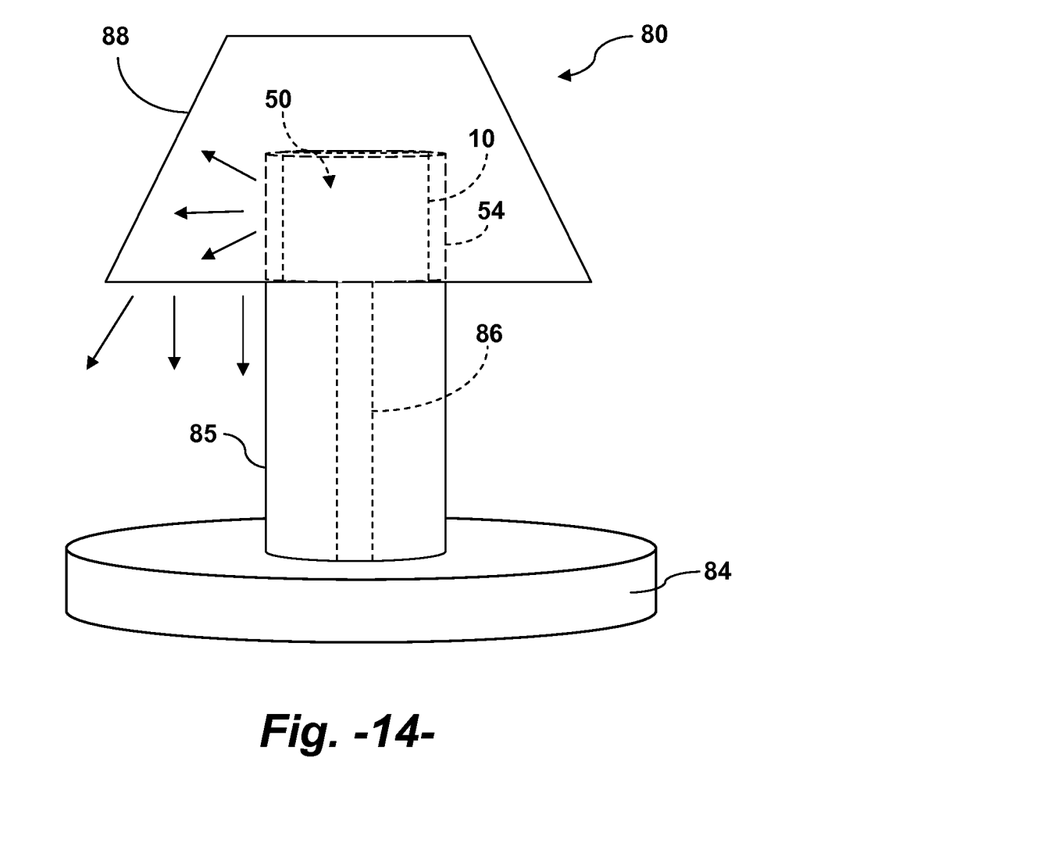
FIG. 14 is a depiction of a luminaire with a cylindrical OLED assembly in accordance with an embodiment of the invention used as a light source therein.
Figure 15:
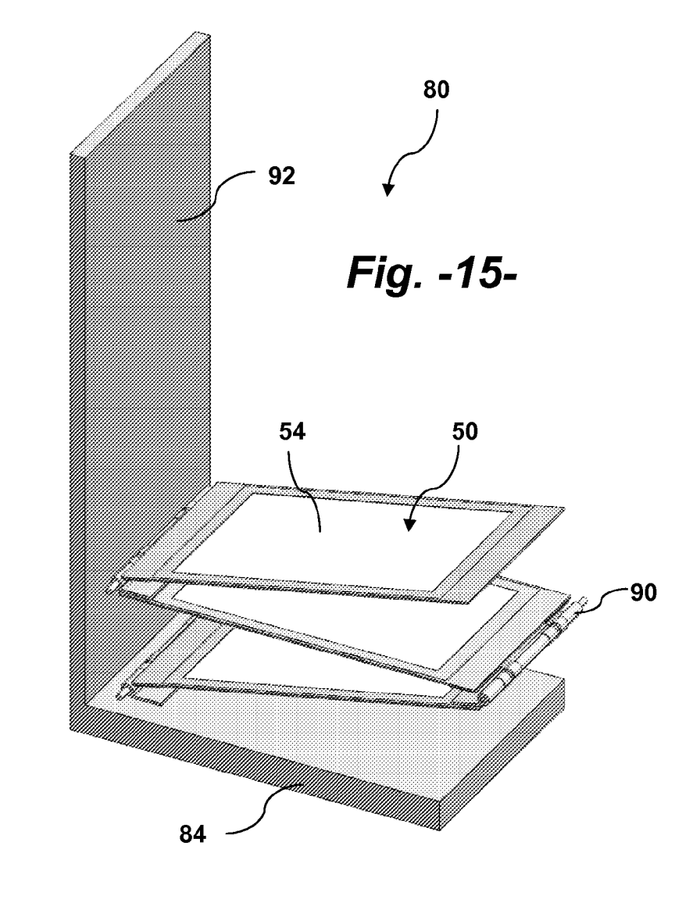
FIG. 15 is a depiction of a luminaire with a plurality of articulable OLED assemblies.
Figure 16:
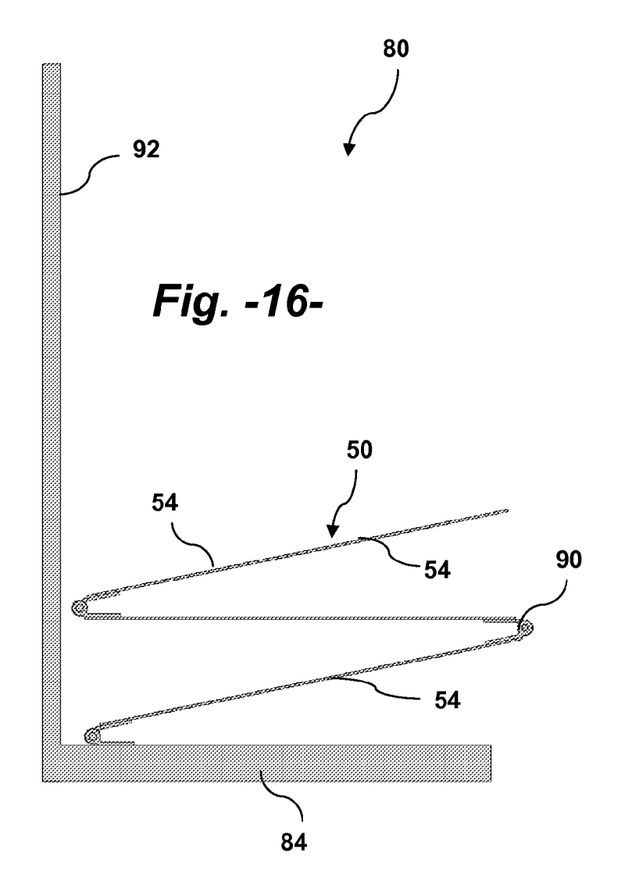
FIG. 16 is a side view of the embodiment of FIG. 15.

FIGS. 3 and 4 depict an embodiment of an OLED assembly 50 in accordance with aspects of the invention. The assembly 50 includes a base 52 upon which an OLED device 10 comprising one or OLED elements 14 is mounted. The base 52 may be any manner of suitable substrate, such as a metal or plastic sheet, or combination of materials. Examples of suitable base materials, suitable OLED materials, and methods of making an OLED device are set forth in U.S. Pat. No. 7,015,640 assigned to the General Electric Company. The base 52 may have any desired shape, size, or configuration, depending on the intended purpose of the OLED assembly 50. The base 52 may include contacts 78 that mate with respective back contacts 79 on the OLED device 10 for supplying power to the anode and cathode layers in the device 10. The contacts 78 may extend from the base 52 and be configured for mating electrical contact with sockets or other electrical connectors in a luminaire 80 (FIGS. 14 through 16). The OLED device 10 may be permanently adhered to the base 52, for example with an adhesive material. In other embodiments, the OLED device 10 may be mechanically (and removably) fastened to the base 52.

One or more light diffuser sheets 54 are attached over the OLED device 10 and desirably has a surface area that covers the active light area of the OLED device 10. The diffuser sheet 54 is attached with any suitable attachment mechanism 56 that renders the sheet 54 readily removable from the assembly 50. For example, in the embodiment of FIGS. 3 and 4, the attachment mechanism includes posts 58 provided around the perimeter of the base 52. These posts 58 have a height so as to extend through holes 68 in the OLED device 10 and holes 70 in the diffuser sheet 54. Removable caps 60 are attached to the distal ends of the posts 58 to securely attach the diffuser sheet 54. The caps 60 may, for example, be threaded onto the posts 58, press-fitted onto the posts 58, and so forth. Removal of the caps 60 allows for ready removal and replacement of the light diffuser sheet 54 with a different type of diffuser sheet.

In an embodiment wherein multiple light diffuser sheets 54 are utilized, the diffuser sheets 54 may be selected to have different properties to achieve an overall desired effect. For example, different diffuser sheets 54 may be selected for a specific color mixing effect. One of the diffuser sheets 54 may be more or less reflective, or more or less light-absorbing, as compared to another sheet 54. Any combination of light diffuser sheets 54 is contemplated for any desired overall effect.

The attachment mechanism 56 may also serve to maintain the OLED device 10 against the base 52 instead of permanently attaching the device 10 to the base 52.

FIG. 4 also depicts use of spacers 66 associated with the attachment mechanism 56. The spacers 66 are disposed between the light diffuser sheet 54 and the OLED device 10 to provide a gap between the components that changes the resulting diffused light as a function of the gap height. In a unique embodiment, the spacers 66 may be adjustable so as to vary the gap height. For example, the spacers 66 may be compressible, whereby the gap height is adjusted by varying the degree of tightening of the caps 60 on the posts 58.

In FIGS. 3 and 4, the base 52 is a relatively inflexible member that retains a final formed shaped without external support structure. Although the base 52 may have some degree of inherent flexibility, the base is "inflexible" in that it retains its shape without external support. For example, the final formed shape may be a flat, planar shape, a cylindrical shape, or any other three-dimensional shape. The OLED device 10 and associated light diffuser sheet 54 may be flexible members that are capable of conforming to the three-dimensional shape of the base 52.

Figure 5:
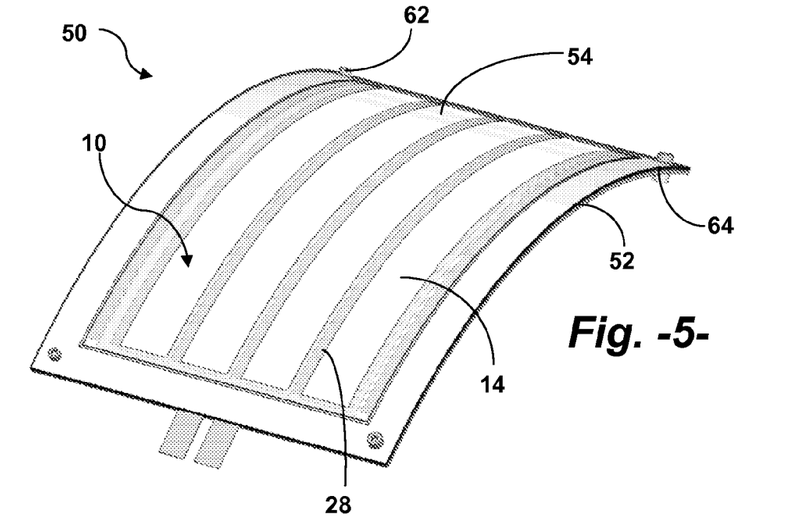
FIG. 5 is perspective view of an OLED assembly in a bent configuration.
Figure 6:
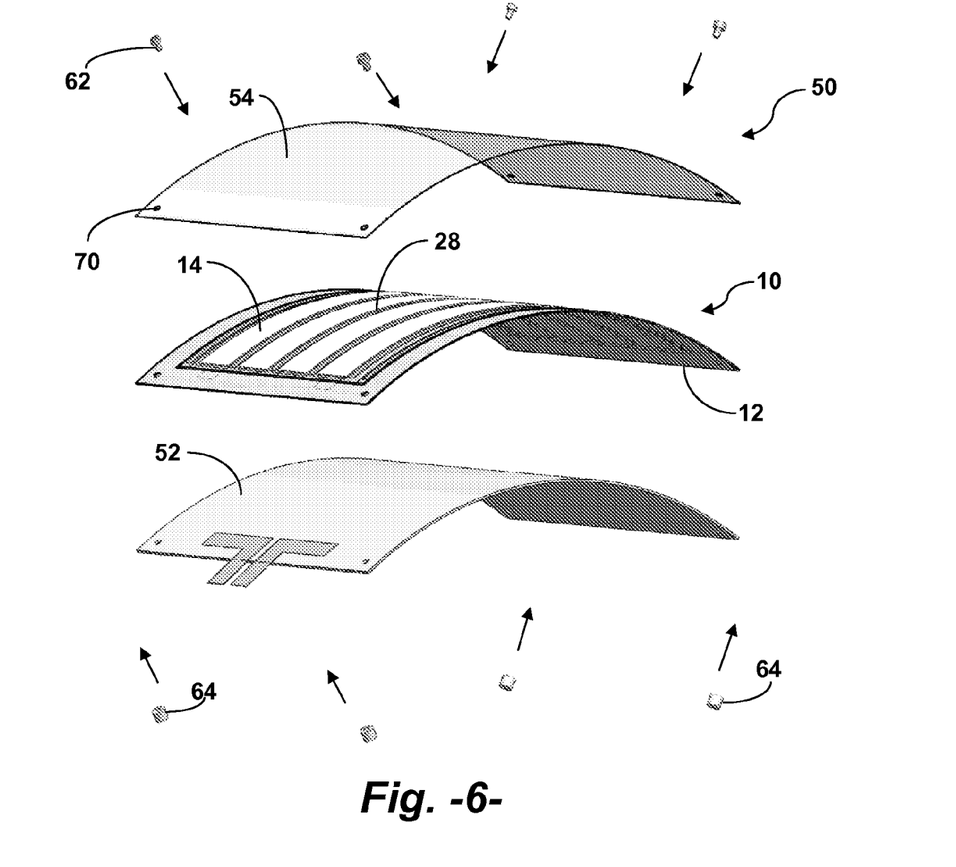
FIG. 6 is a component view of the OLED assembly of FIG. 5.

In the embodiment of FIGS. 5 and 6, the base 52 is depicted as a flexible member that is conformable into a three-dimensional shape. For example, the base 52 may be a flat planar member that is bendable into a cylindrical or semi-cylindrical shape. The OLED device 10 and associated light diffuser sheet 54 are flexible members that conform to the flexible base 52.

The embodiment of FIGS. 5 and 6 also uses a different type of attachment mechanism, which may be any manner of suitable fastener 62, such as a relatively small bolt or other threaded member that is engaged by a nut 64 on the opposite side of the OLED assembly 50. The fastener 62 may be any manner of quick-release device, and so forth. In still other embodiments, the attachment mechanism 56 may be a releasable adhesive applied fully or partially around the circumference of the OLED device 10 or underside of the diffuser sheet 54. A micro hook-and-loop type fastener may also be used in a similar manner.

Various types of light diffusion materials are widely known in the art and suitable for use as a light diffuser sheet 54. In general, a light diffuser sheet is a material that spreads out or scatters incident light to produce a "softer" light. Luminint LLC of Torrance, Calif., USA, provides a line of light diffusing materials under the tradename "Light Shaping Diffusers (LSD)" that are particularly well suited for use in embodiments of the present invention. The LSD product is a weakly diffractive diffuser film with a random holographic surface pattern that performs spectral and angular redistribution of light from coherent and partially coherent sources. The films are offered with circular or elliptical outputs in a variety of substrates, sizes, and diffuser angles.

It should be appreciated that the present invention is not limited to any particular type or supplier of a light diffuser sheet, and that the products from Luminit LLC are described herein for exemplary purposes only. Those skilled in the art recognize that light diffuser sheets or materials may be selected from a wide variety of available materials as a function of the final desired diffused characteristics of the light emitted by the one or more OLED devices 10.

Figure 7:
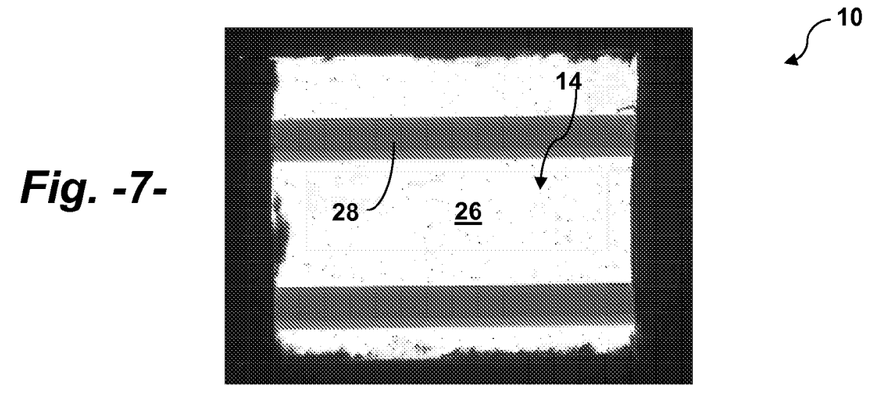
FIG. 7 is a black and white photograph of an OLED device without a diffuser sheet.

FIG. 7 is a photograph of a conventional powered OLED device of the type 10 depicted in FIGS. 1 and 2, and particularly depicts the distinct scribe lines or gaps 28 that separate the light regions 26 of the individual OLED elements 14. The discernable presence of these gaps 28 is not desirable in many luminaire applications, particularly when the OLED device 10 is exposed in plain sight or a soft, homogenized light is desired.

Figure 8:
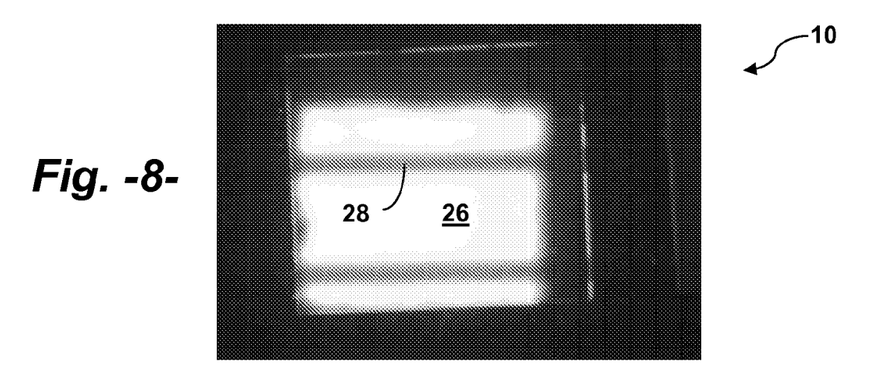
FIG. 8 is a black and white photograph of the OLED device of FIG. 7 with a first type of diffuser sheet applied thereto.

FIG. 8 is a photograph of the OLED device 10 of FIG. 7 with a light diffuser sheet attached over the device 10. The diffuser sheet is a circular output flexible sheet from Luminit LLC with a 5-degree diffusion angle. It is readily apparent from the photograph of FIG. 8 that the diffused light is softer and that the scribe lines 28 are far less distinct.

Figure 9:
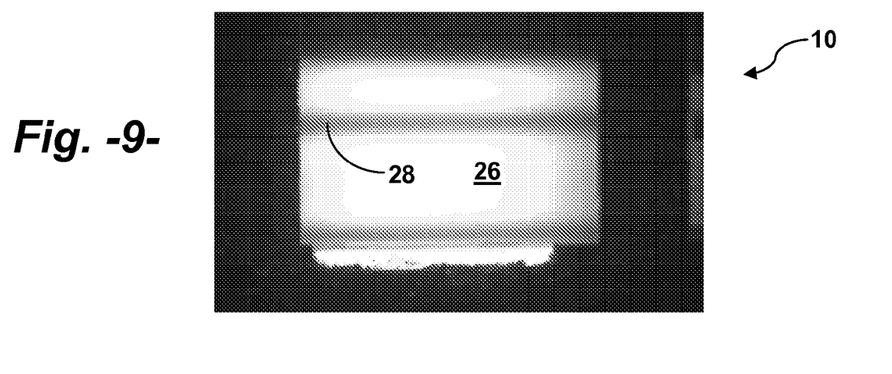
FIG. 9 is a black and white photograph of the OLED device of FIG. 7 with a second type of diffuser sheet applied thereto.

FIG. 9 is a photograph of the OLED device 10 of FIG. 7 with an elliptical output diffuser sheet from Luminit LLC. The sheet has a 5-degree minor axis and 30-degree major axis diffusion angle. The diffused light is soft and the scribe lines 28 are even less noticeable as compared to the embodiment of FIG. 8.

It should be appreciated from FIGS. 7, 8, and 9 that a diffuser sheet may be selected that results in substantial visual reduction (for normal eyesight) of the distinct scribe lines 28 between distinct OLED elements 14, which may be highly desirable in luminaire applications.

Figure 10:
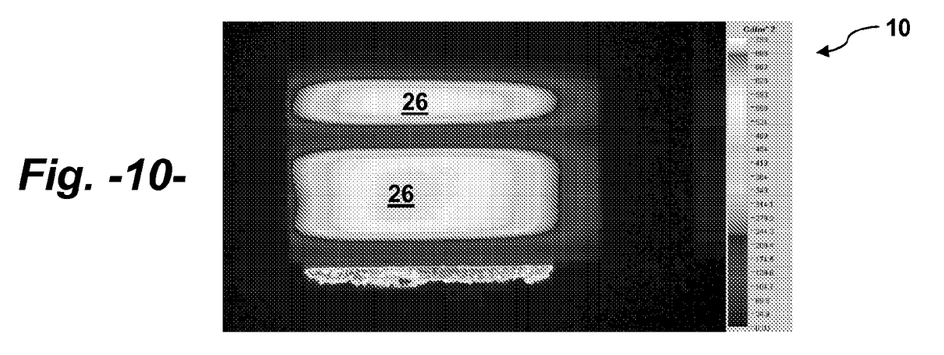
FIG. 10 is a black and white photograph of a multi-colored OLED device without a diffuser sheet.
Figure 11:
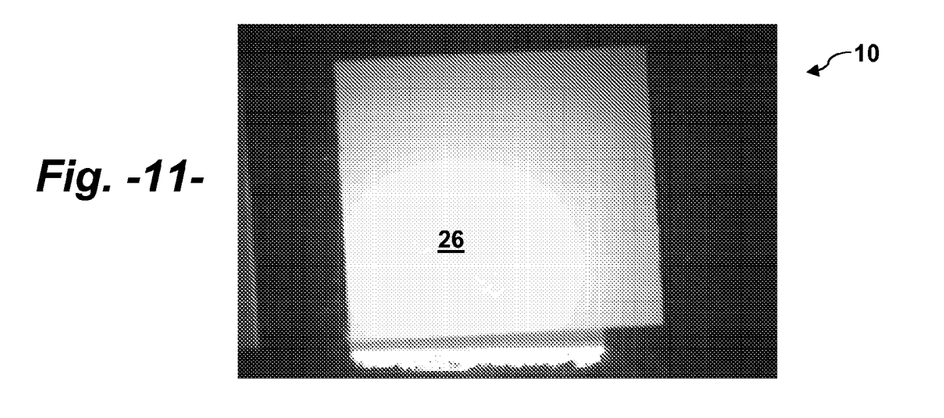
FIG. 11 is a black and white photograph of the OLED device of FIG. 10 with a diffuser sheet applied thereto.

FIG. 10 is a gray scale photograph of an OLED device 10 with different colored OLED elements that produce two distinct and different colored light regions 26. FIG. 11 is a photograph of the OLED device 10 of FIG. 10 with an 80-degree circular output diffuser sheet from Luminit LLC placed over the device. The sheet produces a virtually homogenized light from the two different light sources while eliminating visual boundaries or lines between the light sources. This configuration provides multiple options for mixing light in a luminaire device.

Figure 12:
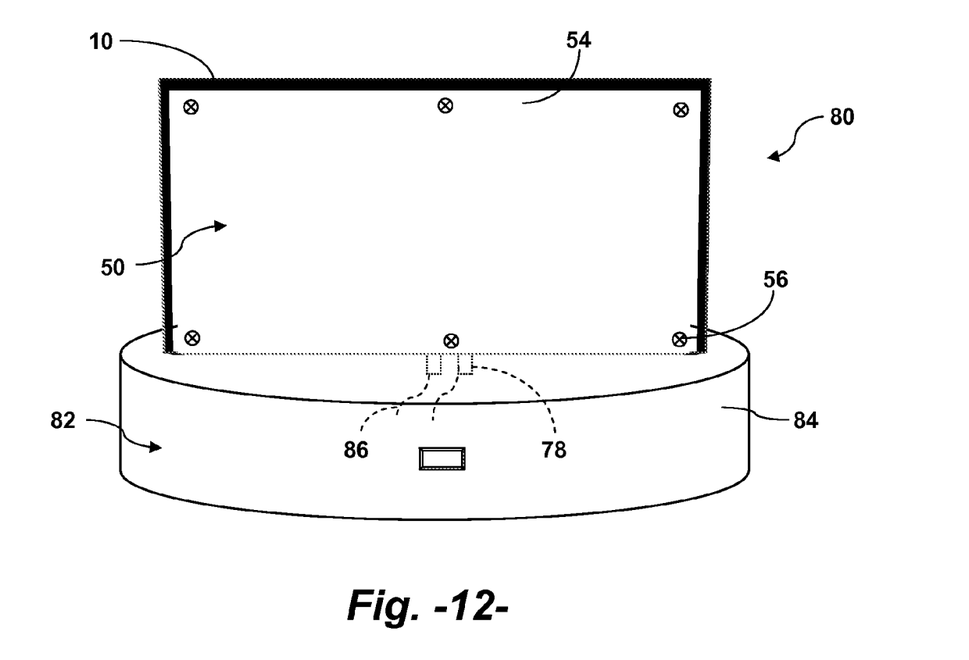
FIG. 12 is a depiction of a luminaire with an OLED assembly in accordance with an embodiment of the invention used as a light source therein.

As mentioned, embodiments of the present invention also encompass any manner of luminaire that utilizes an OLED assembly as presented herein as a light source. For example, FIG. 12 depicts a luminaire 80 that incorporates an OLED assembly 50 in accordance with aspects of the invention. The luminaire 80 includes any manner of fixture 82 in which the OLED assembly is received. The fixture 82 may include a decorative base 84 having sockets or connectors for receipt of the OLED contacts 78. Leads 86 within the base 84 supply power via the contacts 78 to the OLED assembly 50. In FIG. 12, the OLED assembly 50 is depicted as a relatively stiff planar embodiment (e.g., as in FIGS. 3 and 4) that, although may have some degree of flexibility, is generally not intended to be bent or formed into a three-dimensional shape. The OLED assembly 50 may be received in any manner of slot, recess, or other supporting receipt structure defined in the base 84.

Figure 13:
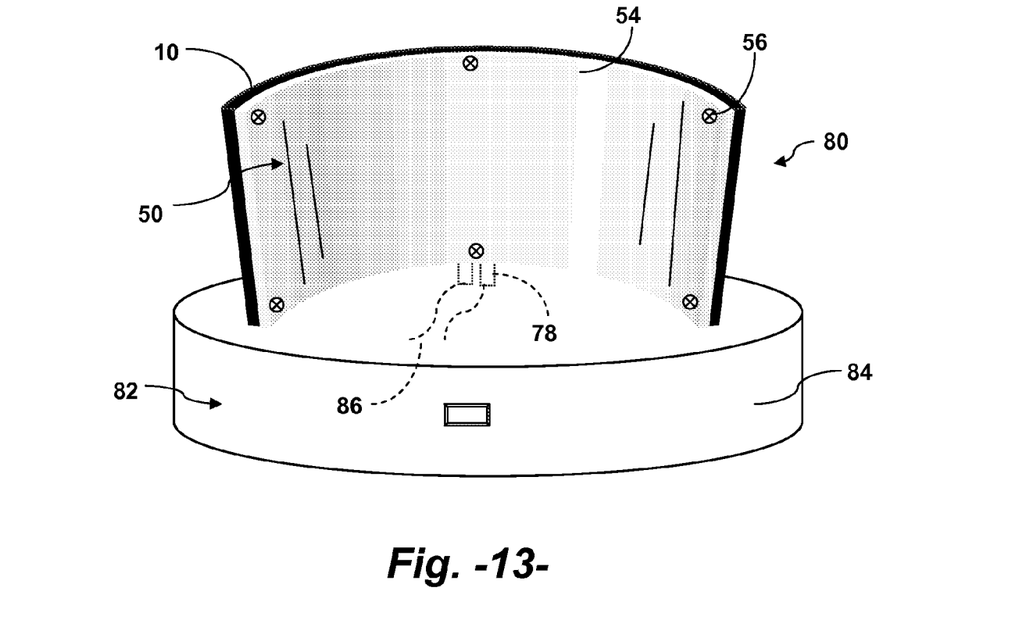
FIG. 13 is a depiction of a luminaire with a flexible OLED assembly in accordance with an embodiment of the invention used as a light source therein.

In the embodiment of FIG. 13, the OLED assembly 50 is depicted as a flexible, conformable member that is formed into a partial cylindrical shape on the fixture base 84. Any manner of curved slot, recess, or other supporting receipt structure may be provided on the base 84 for this purpose.

FIG. 14 depicts an embodiment of a luminaire 80 resembling a traditional lamp. A flexible, conformable OLED device 10 is formed into a cylindrical light source on top of a pole 85 extending from the fixture base 84. A reflective shade 88 is provided to direct and disperse the diffused light from the OLED assembly 50. The shade 88 may have any degree of desired reflectivity, from 100% reflectivity to any degree less than 100% reflectivity. Reflective shades and reflective materials are widely known and used in the lighting industry, and any one or combination of these conventional shades or materials may be used with embodiments of the present invention.

FIGS. 15 and 16 depict an embodiment of a luminaire 80 that incorporates a plurality of OLED assemblies 50 connected in series via any manner of suitable hinge mechanism 90. With this configuration, the assemblies 50 may be independently articulated relative to each other. For example, the assemblies 50 may be articulated so that the plurality of the devices 50 are in common plane relative to the base 84. A reflective wall 92 may extend from the base 84. In an alternate embodiment depicted in the figures, the assemblies 50 define an acute angle between adjacent assemblies 50 and thus produce a markedly different light projection configuration, which will vary as a function of the relative angle between the assemblies 50.

Still referring to FIGS. 15 and 16, each of the assemblies 50 includes at least one light diffuser sheet 54 on at least one side thereof. If the assembly 50 utilizes an omni-direction OLED device (transmits in only one direction), then the light diffuser sheet 54 is attached to the light-emitting side of the assembly 50. In certain embodiments, one or more of the assemblies 50 may incorporate a bi-directional OLED device such that light is emitted from both planar sides of the assembly 50. In this configuration, a light diffuser sheet 54 may be attached to both sides of the assembly, as depicted for example in FIG. 16. It should be appreciated that each of the assemblies 50 may have a different OLED device (e.g., different color, intensity, etc.) and different light diffuser sheet 54 such that each assembly produces a noticeably different diffused light.

By manipulating and arranging the angular orientation of the various assemblies 50, a vast number of mixed light combinations are possible.

The OLED assemblies 50 in FIGS. 15 and 16 are depicted as flat, planar members. The assemblies 50 may also be curved, three-dimensional structures similar to the devices 50 of FIGS. 5 and 6.

Figure 17:
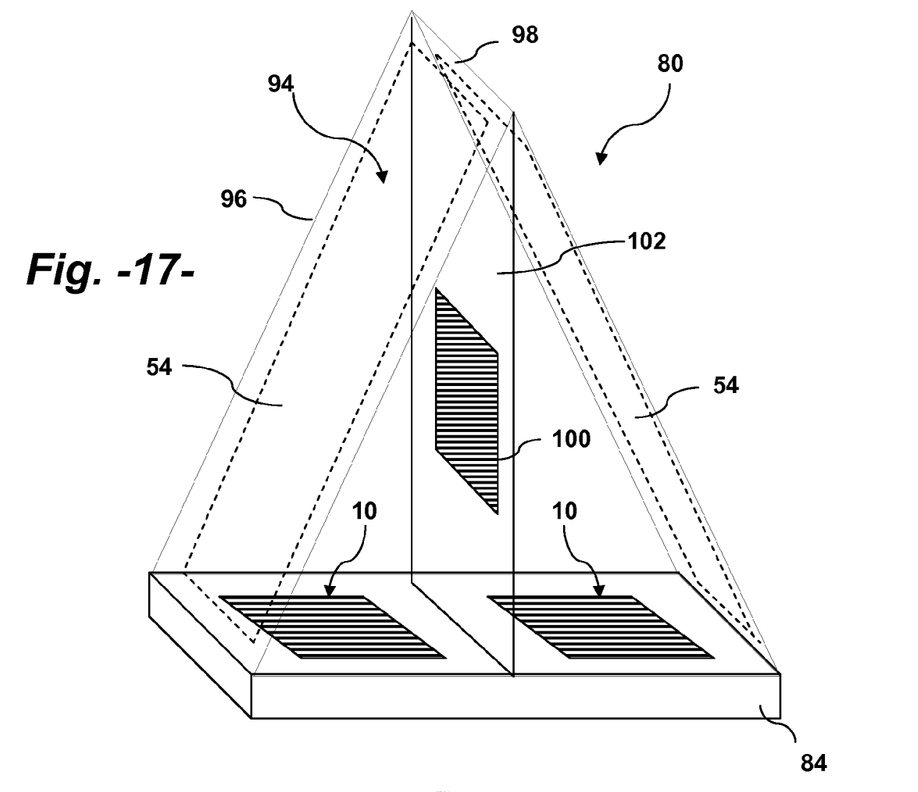
FIG. 17 is a depiction of an exemplary three-dimensional OLED luminaire.
Figure 18:
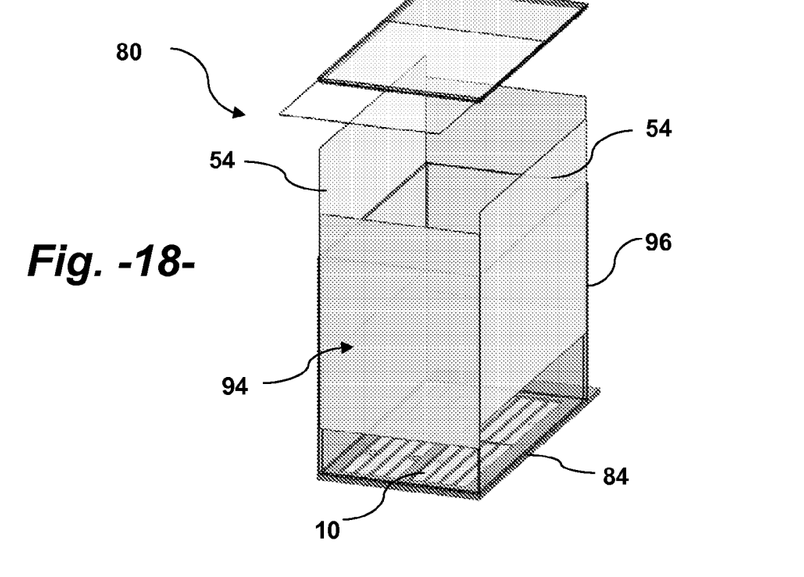
FIG. 18 is a depiction of another embodiment of a three-dimensional OLED luminaire in accordance with aspects of the invention.

FIGS. 17 and 18 depict embodiments of three-dimensional luminaires 80. In FIG. 17, the luminaire 80 is a three-dimensional pyramidal structure having one or more OLED devices 10 mounted on a fixture base 84. Walls 94 extend from the base 84 and meet at an apex 98. The walls 94 include any manner of frame structure 96 in which is fitted a respective diffuser sheet 54. For example, the frame structure 96 may include slots, clips, recesses, or other suitable structure that receives the diffuser sheet 54, with the sheet 54 being readily removable from the frame structure 96 and replaceable with a different diffuser sheet 54.

The three-dimensional luminaire 80 of FIG. 17 includes an additional vertically oriented OLED device 100 configured in an internal wall 102 that extends towards the apex 98. This OLED device 100 is oriented transversely to the base OLED devices 10 and may be a bi-directional OLED device that emits light towards each of the respective diffuser sheets 54, or a single-directional device that emits light towards either of the diffuser sheets 54 depending on its orientation in the wall 102.

The three-dimensional luminaire 80 of FIG. 18 is a box-type of structure wherein a plurality of walls 94 surround the perimeter of the fixture base 84 on which is configured one or more OLED devices 10. The walls 94 may include frame structure 96 in which is received removable and replaceable diffuser sheets 54, as discussed above with respect to FIG. 17.

In any of the OLED assemblies described herein, it should be appreciated that multiple diffuser sheets may be used with the OLED device to achieve any desired light characteristic. For example, multiple diffuser sheets may be used to guide the light, mix colors, change angular orientation of the light, modify the CCT (coordinated color temperature) of the light, and so forth. In a particular embodiment, for example, color can be varied from about 2500K to about 4500K and delta UV can be changed from "+" to "−".

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An OLED assembly, comprising:
    a base;
    an OLED device comprising a plurality of OLED elements mounted on said base;
    a flexible light diffuser sheet removably attached relative to said base and said OLED device;
    a releasable attachment mechanism operably configured between said light diffuser sheet and said base, said releasable attachment mechanism comprising at least one fastener; and
    wherein said light diffuser sheet is oriented relative to said OLED device so as to provide a selected diffusive property to light emitted from said OLED device, said light diffuser sheet removable from said base upon release of said attachment mechanism and substitutable with a different light diffuser sheet having different diffusive properties.

2. The OLED assembly of claim 1, wherein said base comprises electrical contacts that mate with corresponding contacts in a luminaire fixture.

3. The OLED assembly of claim 1, wherein said base is a generally inflexible member such that said OLED assembly maintains a final formed shape without external support.

4. The OLED assembly of claim 3, wherein said base is formed into a three-dimensional shape, said OLED device and light diffuser sheet being flexible members that conform to said three-dimensional shape.

5. The OLED assembly of claim 1, wherein said base is a flexible, conformable member that is bendable into a three-dimensional shape, said OLED device and said light diffuser sheet being flexible members that conform with said base.

6. The OLED assembly of claim 1, wherein said attachment mechanism comprises a plurality of releasable fasteners that extend through aligned holes in said light diffuser sheet and said base.

7. The OLED assembly of claim 1, wherein said attachment mechanism comprises adjustable spacers to change a gap distance between said light diffuser sheet and said OLED device so as to vary the diffusive properties of said light diffuser sheet.

8. The OLED assembly of claim 1, wherein said OLED device comprises a plurality of OLED elements separated by visually distinct boundaries, said light diffuser sheet having diffusive properties such that said boundaries are less visually distinct when viewed through said light diffuser sheet.

9. The OLED assembly of claim 1, further comprising at least one additional said light diffuser sheet having different diffusive properties, said additional light diffuser sheet attachable to said base.

10. An OLED luminaire, comprising:
    a fixture;
    an OLED assembly receivable in said fixture, said OLED assembly further comprising:
        a base;
        an OLED device comprising a plurality of OLED elements mounted on said base;
        a flexible light diffuser sheet removably attached relative to said base and said OLED device;
        a releasable attachment mechanism operably configured between said light diffuser sheet and said base, said releasable attachment mechanism comprising at least one fastener; and
    wherein said light diffuser sheet is oriented relative to said OLED device so as to provide a selected diffusive property to light emitted from said OLED device, said light diffuser sheet removable from said base upon release of said attachment mechanism and substitutable with a different light diffuser sheet having different diffusive properties.

11. The OLED luminaire of claim 10, wherein said OLED assembly is a flexible, conformable member that is bendable from a flat, planar configuration into a three-dimensional shape on said fixture.

12. The OLED luminaire of claim 10, wherein said diffuser sheet comprises diffusive properties that achieve any one or combination of desired reduction in angular light variation, light direction, or CCT modification.

13. The OLED luminaire of claim 10, further comprising a plurality of said OLED assemblies connected in series at hinged connections such that said OLED assemblies are variably angularly positionable relative to each other.

14. The OLED luminaire of claim 13, wherein at least two of said OLED assemblies have different light diffusive properties.

15. The OLED luminaire of claim 10, wherein said OLED assembly comprises a plurality of diffuser sheets arranged in a three-dimensional array on said fixture, said diffuser sheets removable and replaceable in said three-dimensional array with diffuser sheets having different light diffusive properties.

16. The OLED luminaire of claim 15, wherein said three-dimensional array is a pyramidal structure having at least two said diffuser sheets extending from said base and meeting at an apex of said pyramidal structure.

17. The OLED luminaire of claim 16, further comprising a vertically oriented planar OLED device extending from said base towards said apex.

18. The OLED luminaire of claim 15, wherein said three-dimensional array is a multi-sided, box-type structure wherein multiple said diffuser sheets extend from said fixture around a perimeter of said OLED device.

\* \* \* \* \*